(12) United States Patent
Kim et al.

(10) Patent No.: US 6,379,573 B1
(45) Date of Patent: Apr. 30, 2002

(54) SELF-LIMITING ISOTROPIC WET ETCHING PROCESS

(75) Inventors: Eun Sok Kim; Cheol-Hyun Han, both of Honolulu, HI (US)

(73) Assignee: University of Honolulu, Hawaii, HI (US)

( * ) Notice: Subject to any disclaimer, the term of this patent is extended or adjusted under 35 U.S.C. 154(b) by 0 days.

(21) Appl. No.: 09/352,582

(22) Filed: Jul. 13, 1999

(51) Int. Cl.⁷ .......................... B44C 1/22; C03C 15/00
(52) U.S. Cl. .......................... 216/43; 216/41; 216/47; 430/314; 430/316; 428/354
(58) Field of Search ................ 216/41, 43, 47; 428/354, 473.5; 430/314, 316

(56) References Cited

U.S. PATENT DOCUMENTS

| | | | | |
|---|---|---|---|---|
| 4,155,801 A | * | 5/1979 | Provancher | 216/43 |
| 4,247,361 A | * | 1/1981 | Shaheen | 216/43 |
| 4,376,158 A | * | 3/1983 | Spechler | 430/291 |
| 4,621,019 A | * | 11/1986 | Vikesland | 428/347 |
| 5,637,368 A | * | 6/1997 | Cadalbert et al. | 428/40.1 |
| 5,786,055 A | * | 7/1998 | Sei et al. | 428/42 |
| 5,972,234 A | * | 10/1999 | Weng et al. | 216/44 |

* cited by examiner

Primary Examiner—Randy Gulakowski
Assistant Examiner—Shamim Ahmed
(74) Attorney, Agent, or Firm—Flehr Hohbach Test Albritton & Herbert LLP

(57) ABSTRACT

During the formation of a spherical cavity in a substrate, self-limiting etching behavior of an isotropic etchant can be utilized when a tape is used as an etch mask. Such a self-limiting behavior is due to the presence of gas bubbles (consisted of $SiF_4$ and NO, etch by-products) which close the etch window and limit the mass transport of the etchant to this silicon surface. Because of that, the spherical cavity size depends mostly on the size of the etch-mask opening, and is independent of the etching time. This self-limiting etching behavior precisely controls the dimension and uniformity of the spherical cavity.

18 Claims, 5 Drawing Sheets

SELF-LIMITING ISOTROPIC WET ETCHING PROCESS

FIELD OF THE INVENTION

This invention relates to the method of making micromachined devices and semiconductor devices. Specifically, it deals with an isotropic etching method for forming structures on substrates such as silicon, glass or metal, and especially dome-shaped structures.

BACKGROUND OF THE INVENTION

Bulk-micromachined devices are formed by etching a substrate such as silicon, glass or metal. There are two broad categories in bulk micromachining: isotropic etching and anisotropic etching. In isotropic etching, the etchant removes a substrate at a same rate in all directions, independent of the crystal planes, and produces a spherical cavity. This isotropic etching removes the substrate horizontally under an etch mask, and there is a significant amount of undercut beneath the etch mask. Usually wet chemical etchants are used for isotropic etching of silicon. In wet isotropic etching, samples with patterned etch-mask are immersed in an etching solution for a given time. The etching solution removes only the exposed areas. FIG. 1 illustrates a spherical cavity 100 formed by a wet chemical isotropic etching in a silicon substrate 102. The cavity profile and the etch rate are controlled by the etching condition and etchant composition.

The isotropic etching of silicon produces a spherical cavity with excellent sphericity and minimal surface roughness. Usage of a single-crystal silicon which has very few imperfections offers the advantage of an IC-compatible batch process, and the manufacturing cost could be low. For these reasons, chemical isotropic etching methods have been explored to fabricate micromachined devices, semiconductor devices, acoustic lenses for scanning acoustic microscope, optical lenses, and fusion target However, due to absence of an appropriate etch stop, the isotropic etching gives low lateral resolution and poor dimensional control of the etch cavity. Further, the fabrication of a relatively large dome-shaped structure with good sphericity and smoothness in a silicon substrate has not been easy. Earlier efforts resulted in poorly defined boundaries for the cavity. On the other hand, anisotropic etching offers finer lateral resolution and dimensional control; but anisotropic etching limits obtainable cavity shapes to rectangular shapes.

SUMMARY OF THE INVENTION

According to the present invention, a silicon wafer in which the spherical cavity or cavities shall be formed has a layer of tape pasted on a surface to be etched. The tape is preferably a polyethylene tape with a pressure sensitive adhesive. The tape will function as an etch mask.

The tape is patterned, defining a circular opening where the spherical cavity is to be formed. Then the silicon is etched in an isotropic silicon etchant to form spherical etch fronts; because of the tapes resistance to the etchant, the etching step is self-limiting. The etching is followed by dissolving or otherwise removing the tape.

An additional isotropic etching is used to improve the circularity and surface roughness of the etch front. This is achieved by providing a silicon-nitride film on the silicon substrate surface, preferably prior to taping. After the second isotropic etching, the tape is removed.

Using the self-limiting etching phenomenon in an isotropic etching, the dimensions of the desired spherical cavity can be obtained precisely by a photolithographically delineated pattern of the tape. The lateral diameter (at the top surface of the silicon wafer) of the spherical etch front (obtained after the self etch stop) is a function of the mask opening size, independent of the etching time. By keeping the etching condition the same, the lateral diameter of the spherical cavity is reproduced within 4% from sample to sample.

The silicon substrate example is one that has been tested, as described below; the method and use of the tape is also applicable to other substrates such as glass, metal and ceramics.

DETAILED DESCRIPTION OF THE INVENTION

Figure 1:
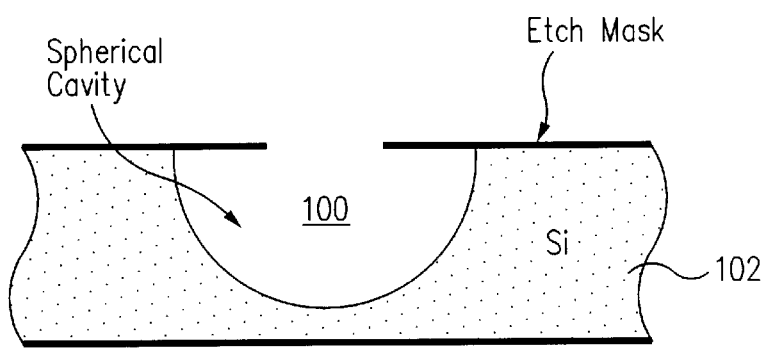
FIG. 1 illustrates the spherical cavity formed by a chemical isotropic etching.

The process steps of this novel self-limiting isotropic etching process are explained below and illustrated in FIGS. 2A–2E. First, in FIG. 2A, 1 $\mu$m thick low stress silicon nitride 200 is deposited (preferably by Low Pressure Chemical Vapor Deposition) on a bare silicon 201 to prevent any possible contamination from the tape. Also, this silicon nitride layer functions as an etch mask in the process step to improve the circularity and roughness simultaneously as will be addressed later.

A tape 202 is pasted or otherwise adhered on the silicon nitride 200, followed by a deposit of Al 204 (about 0.3 $\mu$m thick). This Al film 204 is used as an etch mask to define the boundaries of the opening in the tape 202 through which etching of the silicon cavity occurs. The Al 204 is patterned and then the tape 202 is patterned (FIG. 2B) in an RIE (Reactive Ion Etching) with Oxygen plasma using aluminum film 204 as an etch mask.

Figure 2A:
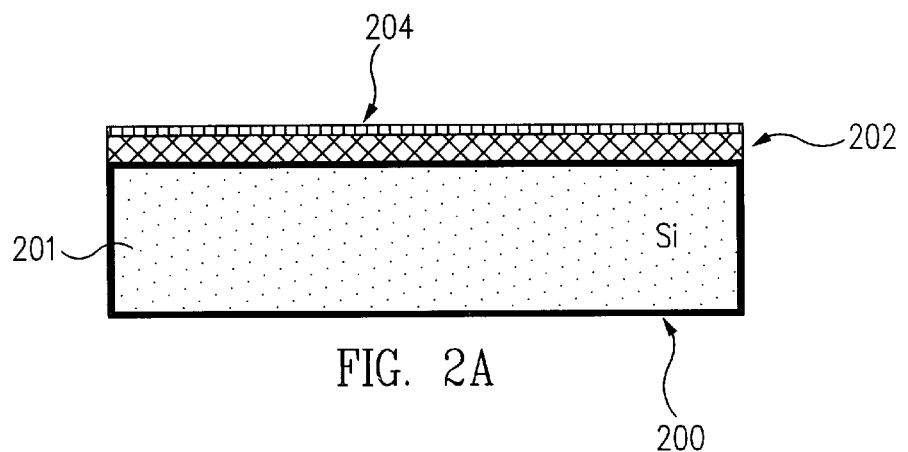
FIGS. 2A–2E illustrates the processing steps to fabricate a spherical cavity by using an isotropic etching with tape as an etch mask.
Figure 2B:
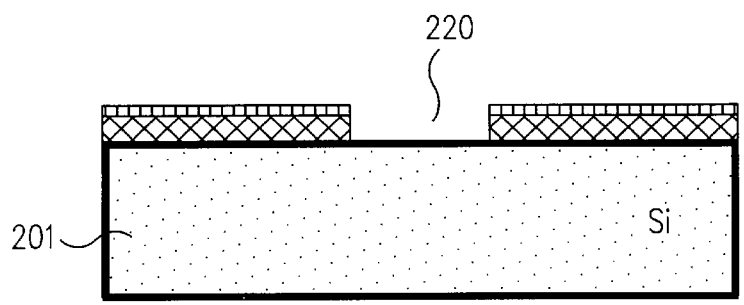
Figure 2C:
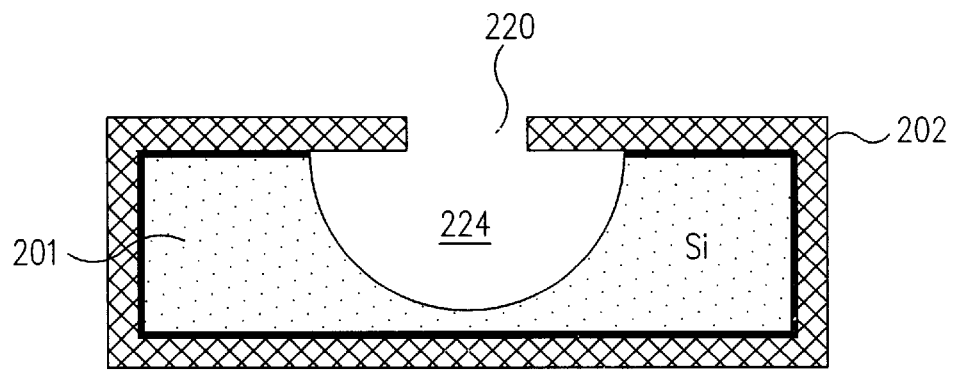
Figure 2D:
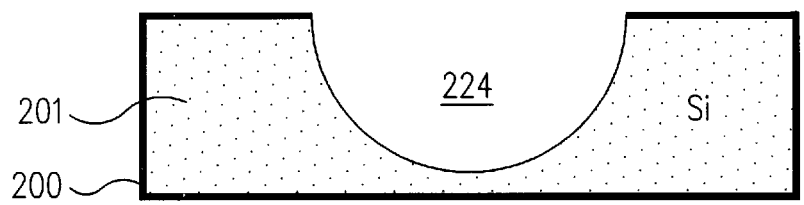
Figure 2E:
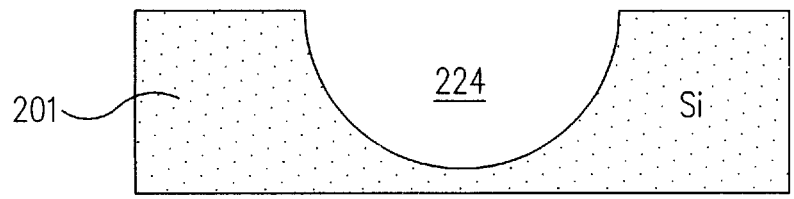

After patterning the tape, the Al film 204 is removed by an Al etchant (e.g., 1 g KOH: 10gK$_3$Fe(CN)$_6$: 100 ml DI water) which rarely deteriorates the tape adhesion. Then the silicon is etched (FIG. 2C) in an isotropic silicon etchant to form spherical etch fronts for the spherical cavities. The relationship between the window 220 which is etched as shown in FIG. 2B using Al as a mask, and the cavity 224 shown in FIG. 2C is described in detail below with reference to FIGS. 3A and 3B.

Figure 3A:
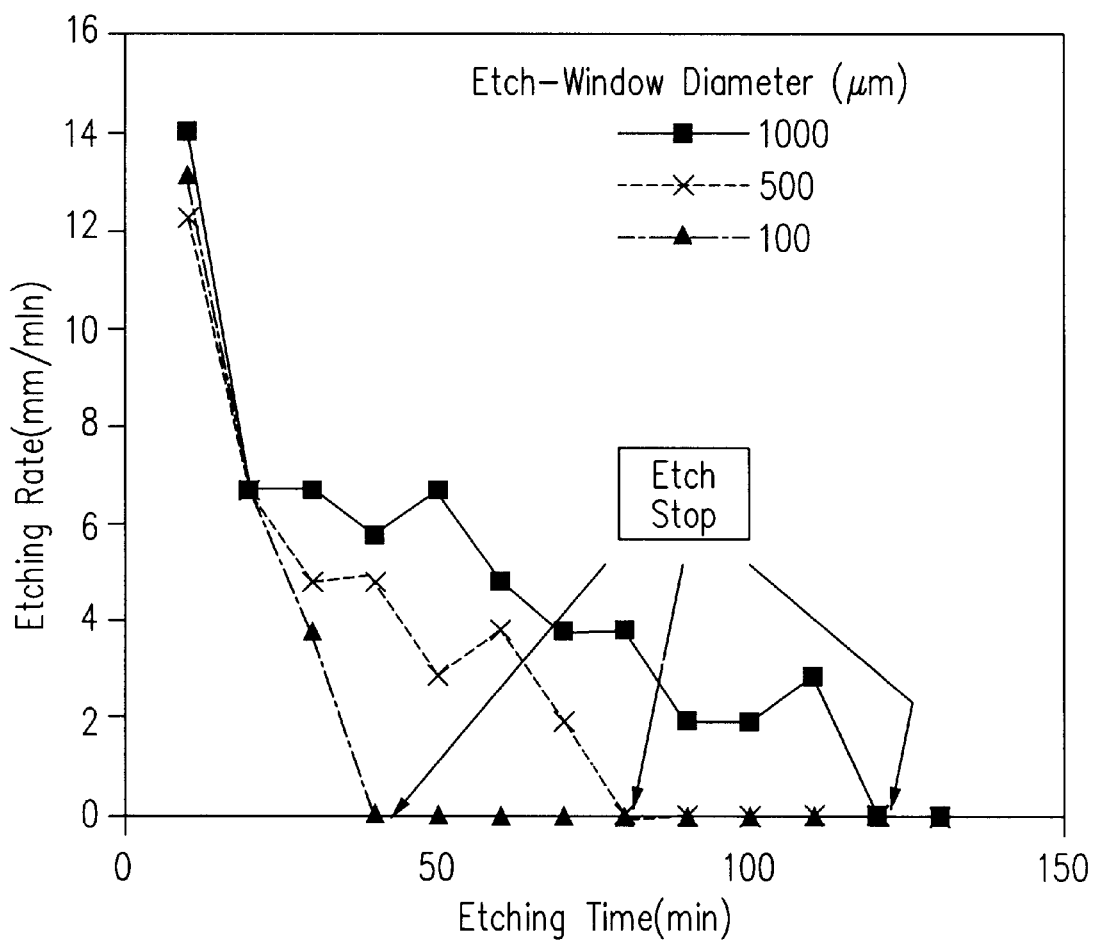
FIG. 3A shows the etch rate vs. the etch time as a function of the etch-window diameter.

The self-limiting etching behavior is studied by immersing 13 pieces of silicon specimens (diced into 15×30 mm$^2$ from a 3" wafer) into the silicon etchant and taking out one sample at a time in the interval of 10 minutes to measure the etch rate. Each of the specimens has various sizes (200–1500 μm) of circular openings on the mask of a tape. The specimens are placed horizontally in the etching chamber. The lateral etch rate is measured by measuring the lateral diameter of the spherical etch front at the top surface of the silicon wafer. The purpose of using various sizes of circular etch windows is to see the effect of the window size on the etch stop behavior. FIG. 3A plots the etch rates as a function of the etching time, and clearly shows the etch-stop effect. When the etch-front diameter is approximately equal to 1.8 times the etch window size plus 400 μm, the etch rate is significantly reduced by the gas bubbles produced by the etching as etch by-products.

Figure 3B:
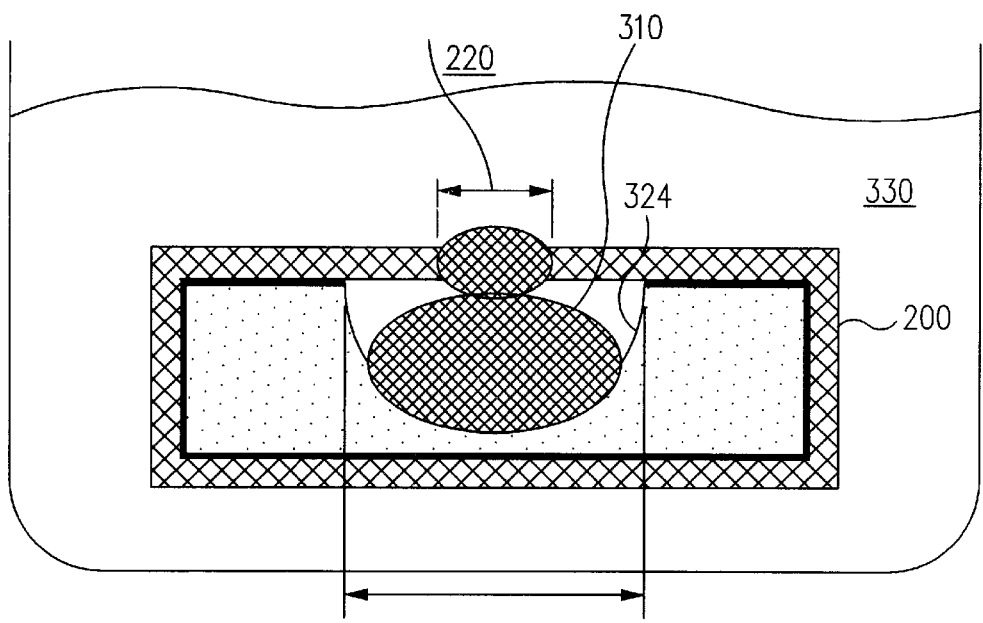
FIG. 3B shows a cross-sectional view of the silicon wafer being isotropically etched. When the etch-front diameter is equal to (1.8 times the etch-window diameter plus 400 $\mu$m). The etch rate is drastically reduced due to the by-product gas bubbles blocking the etch window.

Referring to FIG. 3B, this shows the masked and etched wafer 200 immersed in a silicon etchant 330 as described above. The gas bubbles (produced and accumulated during the etching) limit the mass transport of the etchant to the silicon surface, and cause a self-limiting etching. At the start of the silicon etching, the gas generated as by-products of the etching passes through the etch window 220. But as the etching proceeds, the amount of the gas 310 generated increases due to the increasingly larger etch front. Consequently, the spherical region 324 under the etch window 220 can be filled up with gas bubbles as the gas-generation rate exceeds the rate of gas leaving through the etch window. The gas bubbles accumulated in the spherical region 324 prevent the etchant 330 in which the wafer is immersed from diffusing to the etch front 324 through the etch window 220, as illustrated in FIG. 3B.

Figure 4:
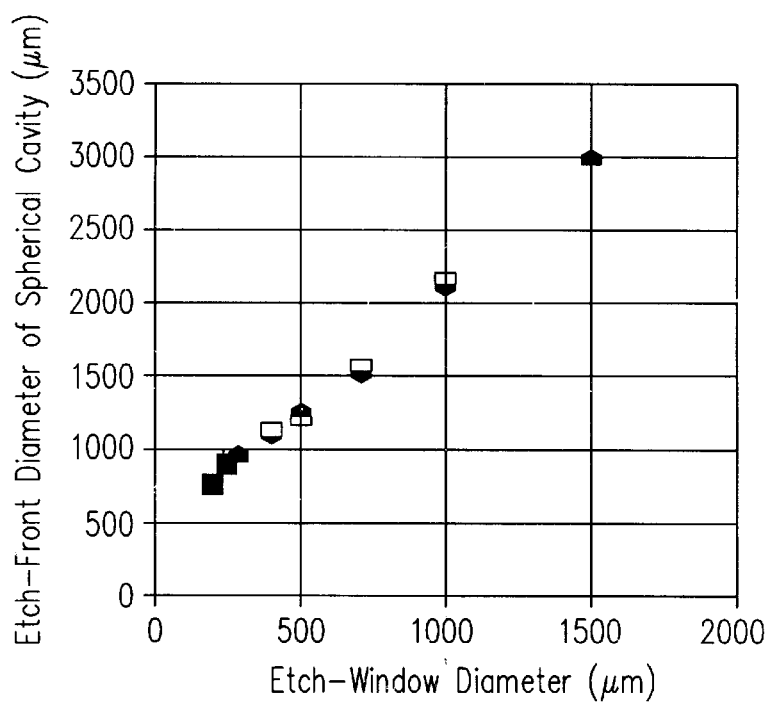
FIG. 4 shows the etch-front diameter (at the top surface of the silicon wafer) of the spherical cavity vs. the mask opening size. The cavity size is measured after etching the silicon beyond the self-etch-stop point.

Using the self-limiting etching phenomenon in isotropic etching, the dimensions of a spherical cavity are precisely controlled by a photolithographically delineated pattern. FIG. 4 shows the lateral diameter (at the top surface of the silicon wafer) of the spherical etch front (obtained after the self etch stop) as a function of the mask or window opening size 220 defined in tape 202. By keeping the etching condition the same, the lateral diameter of the spherical cavity is reproduced within 4% from sample to sample.

In order to use the self-limiting etching phenomenon, it is critical that the etch mask material (tape 202) withstands a strong acidic silicon etchant (composed of HF, $HNO_3$ and acetic acid) for a long time. But the conventional etch-mask materials (such as silicon nitride, silicon oxide, gold with chromium adhesion layer, and parylene) are attacked by the strong acidic etchant, either etched away or peeled off. Trials of various materials as an etch mask for the isotropic etching were conducted, and the results listed in Table 1.

TABLE 1

Various Etch-Mask Materials and Their Properties as an Etch Mask for the Silicon Isotropic Etchant ($HF:HNO_3:HAC$ = 2:3:3) at 50° C.

| Mask Materials | Durability | Adhesion | Attainable Cavity Radius |
|---|---|---|---|
| SiN (2 μm thick) | Fast etched (0.045 um/min) | No peeling off | 0.5 mm |
| Parylene | Hardly etched | Immediately peeling off | — |
| Parylene/A174 | Hardly etched | Peeling off after 20–30 min. | 0.6 mm |
| Tape | Hardly etched | Rarely peeling off | >2.5 mm |
| Cr/Au | Hardly etched | Peeling off after 20–30 min. | 0.5 mm |

TABLE 1-continued

Various Etch-Mask Materials and Their Properties as an Etch Mask for the Silicon Isotropic Etchant ($HF:HNO_3:HAC$ = 2:3:3) at 50° C.

| Mask Materials | Durability | Adhesion | Attainable Cavity Radius |
|---|---|---|---|
| Cr/Polymide | Hardly etched | Peeling off immediately | — |
| PR | Reacts with (the etchant) | Peeling off immediately | — |

The tape (polyethylene backing with acrylic adhesive) patterned by a photolithography method shows to have the best properties as an etch mask in terms of adhesion and durability in the isotropic etchant. The tape mask lasts indefinitely in the strong acidic etchant.

The etching is preferably performed with an etchant composed of 48% hydrofluoric, 70% nitric and 99.5% acetic acids with a ratio of 2:3:3 at 50° C. This etching condition minimizes the dependence of the etch rate on crystal plane.

Also, the spherical etch front can be mirror-like if a 30 min. additional etching in a mixture of HF (1 part), HNO3 (4 parts) and acetic acid (3 parts) is performed at room temperature. For this surface-polishing etch step, the tape 202 can be (and usually is) removed, but the silicon nitride 200 remains in place. The silicon nitride film 200 deposited on the bare silicon as shown in FIG. 2A can be used as an etch-mask layer after removing the tape, and needs no extra etch-mask layer. Etching is conducted without agitation by placing a wafer horizontally in an etchant-filled Teflon beaker located in a water bath. Placing a wafer vertically in the beaker adversely affects the circularity of the etch front. After the completion of this step, the silicon nitride is removed, leaving the finished, etched spherical cavity 224.

Figure 5:
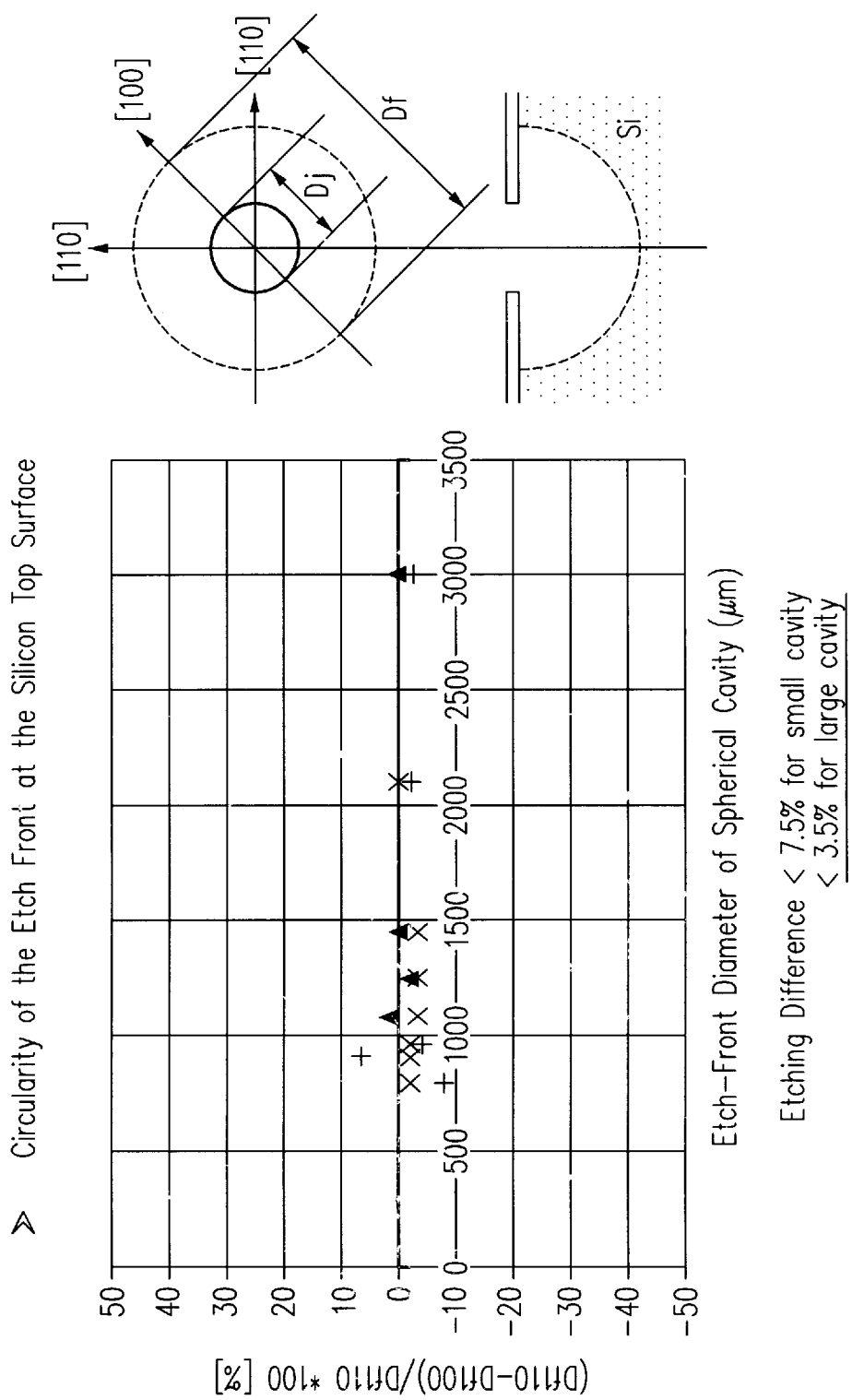
FIG. 5 shows the circularity of the etch front at the top of the silicon wafer after the wet isotropic etching.

FIG. 5 shows the circularity of the etch front at the top of the silicon wafer after the wet isotropic etching. The etch-front diameter of the spherical cavity (Df) is measured with an optical microscope along the [100] and [110] axis after the isotropic etching. Then Df(100) and Df(110) are compared to find out the etching difference. The difference is typically maintained within 7.5% from wafer to wafer; and the difference is reduced to less than 3.5% for a larger spherical cavity.

The method described has many advantages. Precise and uniform control on the etch dimension is achieved. The isotropic etching pattern and structure are produced without restriction on etching time. The fabrication process is simplified due to its fast and easy technique which requires no vacuum system. The use of low-cost materials greatly reduces the total cost. The attainable cavity radius can be greater than 2.5 mm, substantially larger than achieved with other processes.

Several alternatives to the above description of a preferred embodiment may be used without departing from the spirit and scope of the invention. For example, a layer of Al is used as a mask to pattern the tape. This could be replaced by the combination of a dry film photoresist with a tape backing as described above. This would allow to simplify the process to pattern the tape without an additional mask layer.

In summary, the above application discloses a method of isotropically etching substrates including (but not limited to) silicon, glass, metal, ceramics, etc., comprising the steps of pasting tape as an etch mask over said substrate, photolithographically defining an opening in said tape for said etching, then removing said substrate by said etching. The etching is self-limiting due to the patterned said tape causing blockage of mass transport of etchants after a certain point. The self-limiting etching is caused by by-product gases of said etching, and is used for controlling the etch dimension precisely and reproducibly. The self-limiting etching is used for photolithographically defining the etch dimension so that the dimension is independent of the etching time. The patterned tape comprises mainly backing material and pressure sensitive adhesive. The backing material protects the substrate from a strong acidic etchant, while the adhesive above makes said backing material remain on said substrate in said etchant. The tape preferably comprises polyethylene backing with acrylic adhesive; the tape is preferably thinned to a total thickness in the range of 1 $\mu$m–50 $\mu$m. More particularly, the tape is preferably thinned to 1–20 $\mu$m thick polyethylene backing, with 1–30 $\mu$m thick acrylic adhesive.

A pad layer between said tape and said substrate is used for preventing contamination; the pad layer above is used as an etch mask for an additional etching after said etching with said tape. The additional etching is performed utilizing a mixture of HF(1 part) HNO$_3$ (4 parts) and acetic acid (3 parts) to produce a mirror-like finish after removing said tape. The tape is patterned by any of dry etching processes such as reactive ion etching with Al mask layer. Alternatively, the tape contains a dry film photoresist in addition to backing material and adhesive. The tape having said dry film photoresist is patterned without an additional mask layer such as said Al at claim 7. The tape is preferably comprised of photoresist on top of polyethylene backing with acrylic adhesive. In the alternative approach using a dry-film photoresist, the tape would have a thickness of about 10 $\mu$m to about 60 $\mu$m.

Other features and advantages of the invention may become apparent to a person of skill in the art who studies the disclosure; the scope of the invention is to be limited only by the following claims.

What is claimed:

1. A method of isotropically etching substrates comprising the steps of:

pasting tape over said substrate, photolithographically defining an opening in said tape after said tape is pasted over said substrate, then removing a part of said substrate by said isotropic etching.

2. The method of claim 1, wherein said etching is self-limiting due to the patterned said tape causing blockage of mass transport of etchants after a certain point.

3. The method of claim 1, wherein said substrates are chosen from a group consisting of silicon, glass, metal and ceramics.

4. The method of claim 2, wherein said self-limiting etching is controlled by by-product gases of said etchant, said self-limiting etching is used for controlling the etch dimension precisely and reproducibly said self-limiting etching is used for photolithographically defining the etch dimension so that said dimension is independent of the etching time.

5. The method of claim 1, wherein said tape comprises backing material and pressure sensitive adhesive, said backing material above protects said substrate from a strong acidic etchant, while said adhesive makes said backing material remain on said substrate in said etchant, said tape preferably comprises polyethylene backing with acrylic adhesive said tape is preferably thinned to a total thickness in the range of 1 $\mu$m–50 $\mu$m said tape is preferably thinned to 1–20 $\mu$m thick polyethylene backing with 1–30 $\mu$m thick acrylic adhesive.

6. The method of claim 5, wherein said tape comprises polyethylene backing with acrylic adhesive.

7. The method of claim 6, wherein said tape has a total thickness in the range of 1 $\mu$m–50 $\mu$m.

8. The method of claim 6, wherein tape comprises 1–2 $\mu$m thick polyethylene backing and 1–3 $\mu$m acrylic adhesive.

9. A method of claim 1, wherein a pad layer is disposed between said tape and said substrate for preventing contamination, said pad layer above is used as an etch mask for an additional etching after said etching with said tape.

10. The method of claim 9 comprising reusing said pad layer but not said tape, and using said pad layer as a secondary etch mask for additional etching after etching with said tape.

11. The method of claim 10, wherein said pad layer comprises silicon nitride.

12. A method of claim 11, wherein said additional etching is performed utilizing a mixture of HF (1 part) HNO3 (4 parts) and acetic acid (3 parts) to produce a mirror-like finish after removing said tape.

13. The method of claims 11 including depositing a mask layer over said tape, and patterning said tape to define said opening.

14. The method of claim 13, wherein said tape is patterned with a reactive ion etching process.

15. The method of claim 1, wherein said tape comprises a dry film photoresist in addition to backing material and adhesive.

16. A tape that is comprised of a dry film photoresist on top of polyethylene backing with acrylic adhesive.

17. The method of claim 10, wherein said tape comprises a photoresist in addition to backing material and adhesive.

18. A tape that comprises a photoresist on top of polyethylene backing with acrylic adhesive.

* * * * *